US012713645B2

(12) United States Patent
Wu et al.

(10) Patent No.: US 12,713,645 B2
(45) Date of Patent: Aug. 18, 2026

(54) SEMICONDUCTOR DEVICE HAVING CONTACT FIELD PLATE (CFP) AND METHOD FOR MANUFACTURING THE SAME

(71) Applicant: TAIWAN SEMICONDUCTOR MANUFACTURING COMPANY LTD., Hsinchu (TW)

(72) Inventors: Yun-Chi Wu, Tainan City (TW); Shih-Jung Tu, Tainan City (TW); Po-Wei Liu, Tainan City (TW); Yuan-Cheng Yang, Tainan City (TW); Chia-Ta Hsieh, Tainan City (TW); Wan-Hua Huang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 440 days.

(21) Appl. No.: 18/531,746

(22) Filed: Dec. 7, 2023

(65) Prior Publication Data

US 2025/0194144 A1 Jun. 12, 2025

(51) Int. Cl.

| | |
|---|---|
| ***H10D 30/65*** | (2025.01) |
| ***H10D 30/01*** | (2025.01) |
| ***H10D 64/00*** | (2025.01) |
| ***H10D 64/01*** | (2025.01) |

(52) U.S. Cl.

CPC ......... *H10D 30/65* (2025.01); *H10D 30/0281* (2025.01); *H10D 64/021* (2025.01); *H10D 64/111* (2025.01)

(58) Field of Classification Search

CPC ... H10D 64/112; H10D 64/111; H10D 64/516

See application file for complete search history.

(56) References Cited

U.S. PATENT DOCUMENTS

| | | | | |
|---|---|---|---|---|
| 2019/0288066 A1* | 9/2019 | Lee | ...................... | H10D 30/603 |
| 2019/0363188 A1* | 11/2019 | You | ......................... | H10P 30/21 |
| 2022/0384637 A1* | 12/2022 | Perng | ..................... | H10D 30/65 |

* cited by examiner

*Primary Examiner* — Alia Sabur

(74) *Attorney, Agent, or Firm* — WPAT LAW; Anthony King

(57) ABSTRACT

A method for manufacturing a semiconductor device is provided. A gate oxide layer is formed over an N-type well region and a P-type well region. The gate oxide layer comprises an input/output (I/O) oxide layer portion and a reduced surface field oxide (ROX) layer portion. A poly gate is formed on the I/O oxide layer portion. The poly gate extends along an interface between the N-type well region and the P-type well region. At least one poly strap is formed on the ROX layer portion. A resist protect oxide (RPO) layer is formed to completely cover the poly strap and partially cover the poly gate. An inter-level dielectric (ILD) layer is formed over the RPO layer. A connecting feature is formed to penetrate the ILD layer and the RPO layer to contact the poly strap.

20 Claims, 15 Drawing Sheets

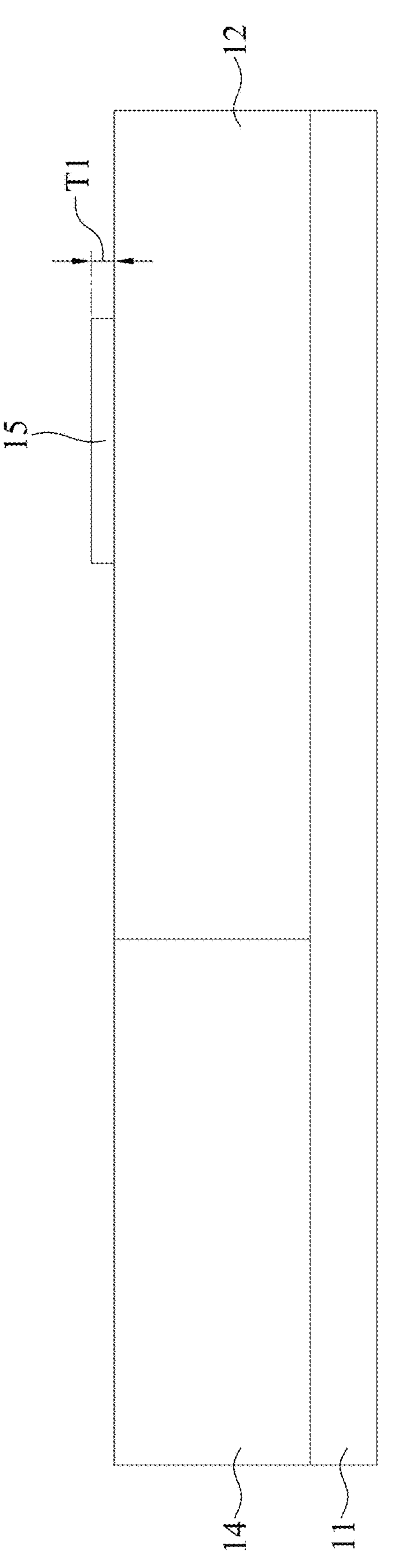
FIG. 2
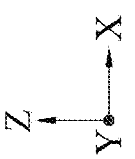

SEMICONDUCTOR DEVICE HAVING CONTACT FIELD PLATE (CFP) AND METHOD FOR MANUFACTURING THE SAME

BACKGROUND

Bipolar/CMOS/DMOS (BCD) devices include a bipolar region to perform analog functions, a complementary metal oxide semiconductor (CMOS) region to perform digital functions and a double diffused metal oxide semiconductor (DMOS) region including power and high-voltage devices. BCD devices are used in communications applications such as phones and tablets as well as automotive applications, e.g. for mirror positioning, seat adjustment and others. By integrating three distinct types of components on a single die, BCD technology can reduce the number of components in the bill of materials (BOM). Fewer chip components in the BoM conserves board footprint, and thus reduces costs.

Providing ease of integration and compatibility of control circuitry, laterally diffused metal-oxide-semiconductors (LDMOS) are widely used in power devices for BCD technology, with power consumption of major concern in LDMOS devices. A power LDMOS delivering higher breakdown voltage (BV) while minimizing specific on-resistance (Rds(on)) is called for to reduce conduction loss. An ultra-low Rds(on) is desirable for quick-charging devices to achieve high current capacity.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2 to 10 are schematic views of intermediate stages of the method depicted in FIG. 1.

DETAILED DESCRIPTION

Figure 1:
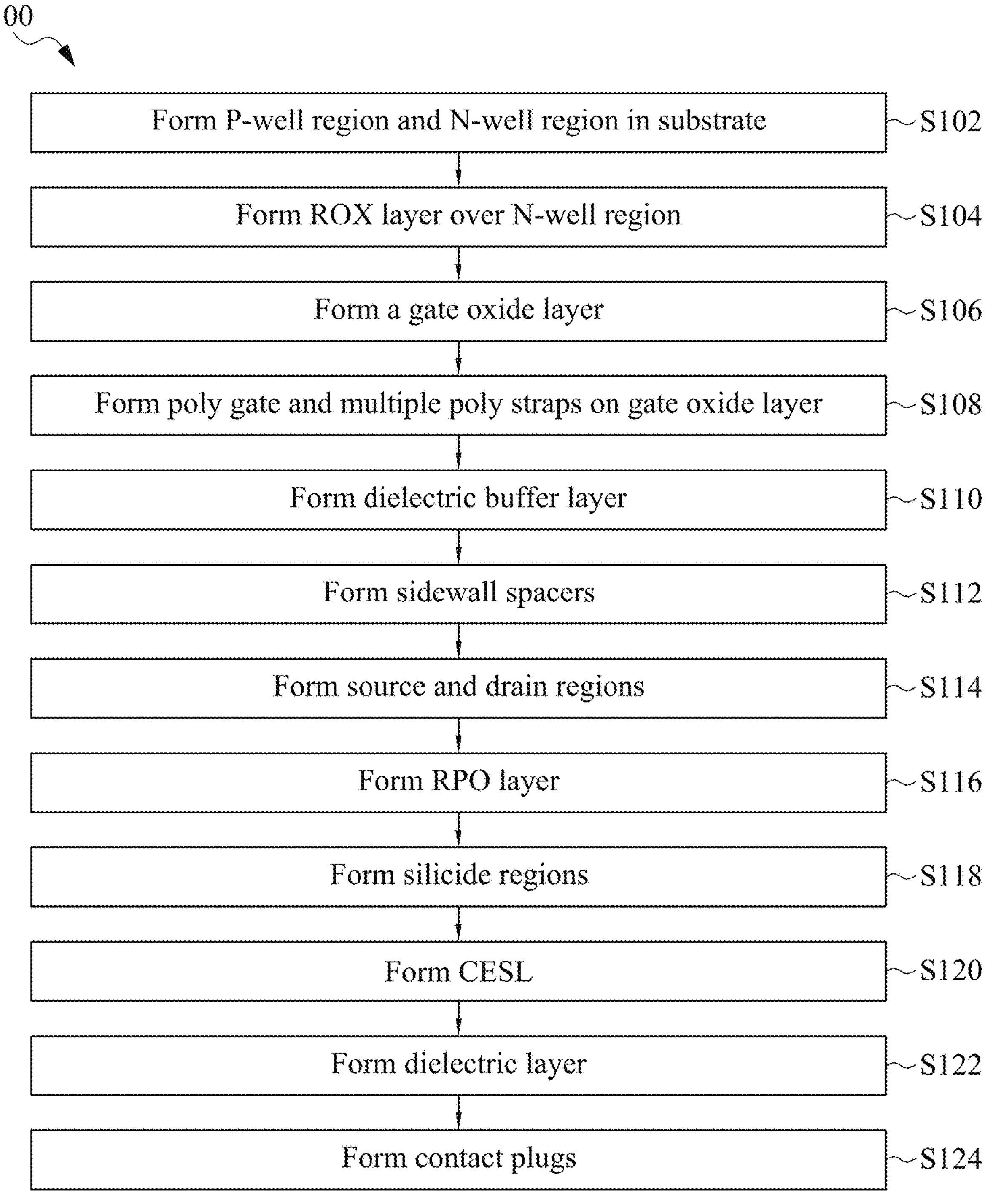
FIG. 1 is a flowchart of a method for manufacturing a semiconductor device having a contact field plate (CFP), in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as “beneath,” “below,” “lower,” “above,” “upper,” “lower,” “left,” “right” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being “connected to” or “coupled to” another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term “about” generally means within 10%, 5%, 1%, or 0.5% of a given value or range. Alternatively, the term “about” means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term “about”. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various structures of semiconductor devices, and specifically Bipolar/CMOS/DMOS (BCD) devices are provided in accordance with various exemplary embodiments. Some variations of some embodiments are discussed. Throughout the various views and illustrative embodiments, like reference numbers are used to designate like elements.

High voltage transistor devices are often constructed as field plates. Field plates are conductive elements placed over a channel region to enhance performance of a high voltage transistor device by manipulating the electric field generated by the gate electrode (e.g., reducing the peak electric field).

By manipulating the electric field generated by the gate electrode, high voltage transistor devices can achieve higher breakdown voltages. For example, LDMOS (Laterally Diffused Metal Oxide Semiconductor) transistor devices typically include field plates extending to an adjacent drift region disposed between the channel region and the drain region.

Field plates can be formed in many different ways. One is a high-voltage transistor device with a field plate of non-gate material (such as a contact field plate (CFP)), formed simultaneously with the back-end-of-line (BEOL) metal layer to reduce manufacturing costs. The CFP is laterally surrounded by an inter-level dielectric (ILD) layer. Biasing the CFP with voltage of the source region provides high voltage LDMOS devices with low on-state resistance Rds (on) and low dynamic power dissipation for good performance during high frequency switching.

According to the embodiments of the present disclosure, semiconductor devices with CFP and a manufacturing method for the same are provided. In the semiconductor devices, multiple poly straps and a reduced surface field oxide (Resurf oxide (ROX)) layer prevent over-etching of the CFP, protecting the drain region from direct shorts to the active region from stress and cracks of conventional composite etch stop layers, thus improving yield. Furthermore, by forming the poly straps and the thicker ROX layer between the poly gate and the drain region, gate induced drain leakage (GIDL) is decreased. Moreover, process of the semiconductor device is compatible with regular logic process and requires no composite etch stop layer, thereby decreasing manufacturing costs.

FIG. 1 illustrates a method 100 for manufacturing a semiconductor device having a CFP, in accordance with some embodiments of the disclosure. FIGS. 2 to 10 are schematic views of a semiconductor device 10 having a CFP during various stages of the method 100 of FIG. 1. The semiconductor device 10 is configured as an N-type LDMOS device in the illustrated embodiments. Other suitable configurations for the semiconductor device 10 are within the contemplated scope of the present disclosure. For example, in some embodiments, the semiconductor device 10 may be configured as a P-type LDMOS device. The method 100 and the semiconductor device 10 are collectively described as follows. However, additional operations can be provided before, after, or during the various stages of the method 100, and some of the operations described herein may be replaced with other operations or be eliminated. Similarly, further additional features may be present in the semiconductor device 10, and/or features present may be replaced or eliminated in additional embodiments.

Referring to FIG. 1, the method 100 proceeds to operation S102, in which an N-type well region and a P-type well region are formed in a substrate, and then to operation S104, in which a reduced surface field oxide (ROX) layer is formed on the N-type well region.

Referring to the example of FIG. 2, the semiconductor device 10 is formed in an active region (or oxide diffusion (OD) area) defined by a shallow trench isolation (STI) (not shown) in a substrate 11. An N-type well region 12 and a P-type well region 14 are formed in the substrate 11. The N-type well region 12 may be alternatively referred to as a power N-type well region (or a high voltage N-type well region), and may function as a drift region for the N-type LDMOS device. The formation of the N-type well region 12 may be performed before or after the formation of the P-type well region 14. The N-type well region 12 may be formed by implanting an N-type doping material through a patterned photoresist layer (not shown), and the P-type well region 14 may be formed by implanting a P-type doping material through another patterned photoresist layer (not shown).

In some embodiments, the substrate 11 is elemental semiconductor material, such as, but not limited to, crystalline silicon, diamond, or germanium; compound semiconductor materials, such as, but not limited to, silicon carbide, gallium arsenic, indium arsenide, or indium phosphide, or alloy semiconductor materials, such as, but not limited to, silicon germanium, silicon germanium carbide, gallium arsenic phosphide, or gallium indium phosphide. Other suitable materials are within the contemplated scope of the present disclosure. The substrate 11 may be a bulk silicon substrate, a silicon-on-insulator (SOI) substrate, or a germanium-on-insulator (GOI) substrate. In some embodiments, the substrate 11 includes a P-type substrate.

In some embodiments, the N-type doping material of the N-type well region 12 includes, for example, but is not limited to, phosphorus, arsenic, nitrogen, antimony, or combinations thereof. Other suitable doping materials are within the contemplated scope of the present disclosure. The P-type doping material of the P-type well region 14 includes, for example, but is not limited to, boron, gallium, aluminum, indium, or combinations thereof. Other suitable doping materials are within the contemplated scope of the present disclosure. In some embodiments, the P-type well region 14 may be formed by diffusion.

In FIG. 2, a ROX layer 15 is formed and patterned on the N-type well region 12. The ROX layer 15 can be, for example, but is not limited to, a silicon dioxide ($SiO_2$) layer with thickness T1 ranging from 300 Å to 500 Å. In some embodiments, the ROX layer 15 can be grown using thermal oxidation or in-situ steam generation (ISSG), and then patterned by a suitable process known to those skilled in the art of semiconductor fabrication.

Referring to FIG. 1, the method 100 proceeds to operation S106, in which a gate oxide layer is formed, and then to operation S108, in which a poly gate and multiple poly straps (islands or slots) are formed on the gate oxide layer.

Figure 3:
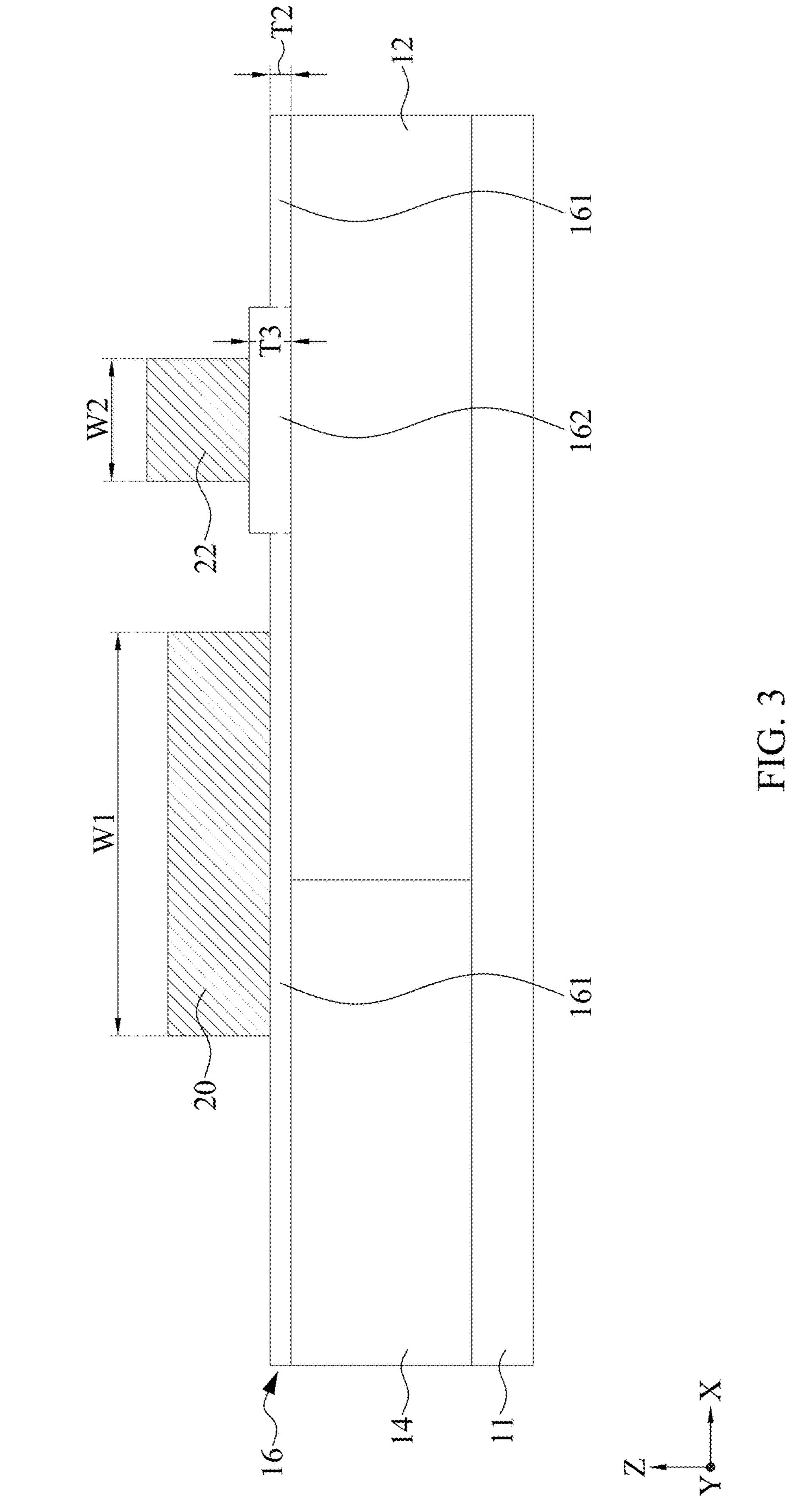
Figure 4:
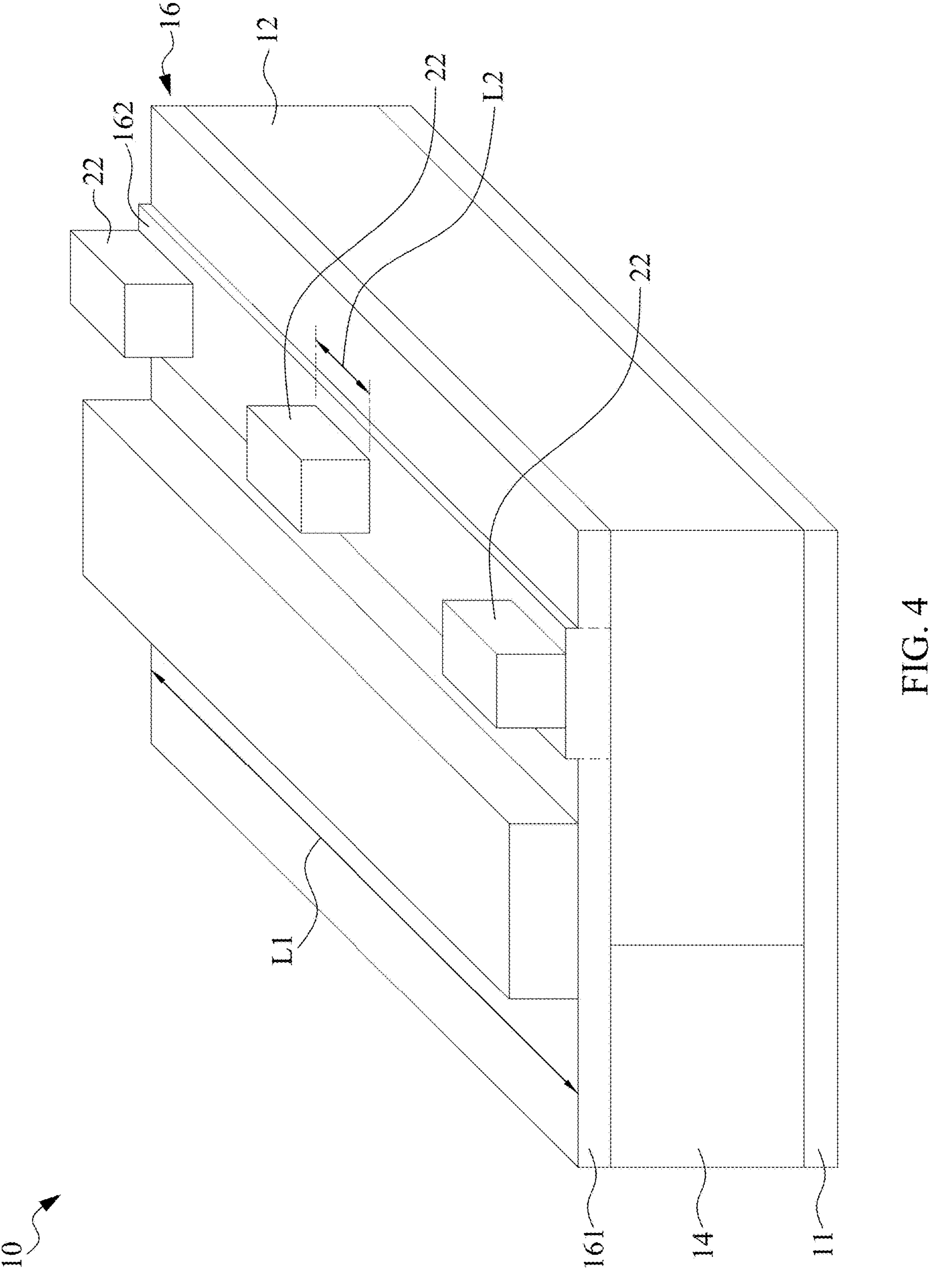

FIG. 3 is a cross-section of semiconductor device 10. A gate oxide layer 16 is formed over the substrate 11, and the gate oxide layer 16 includes an input/output (I/O) oxide layer portion 161 having a thickness T2 and a ROX layer portion 162 having a thickness T3 ranging from 400 Å to 600 Å. The ROX layer portion 162 is formed over the N-type well region 12. A thickness ratio of the ROX layer portion 162 to the I/O oxide layer portion 161 is greater than 3. In some embodiments, the thickness T2 (e.g., 130 Å) is less than the thickness T1. In some embodiments, a difference between the thickness T2 and the thickness T3 is determined by the thickness T1. Furthermore, the bottom surfaces of the I/O oxide layer portion 161 and the ROX layer portion 162 are at the same level.

In some embodiments, the gate oxide layer 16 is a fully oxidized gate oxide layer. The fully oxidized gate oxide layer may be formed by, for example but not limited to, rapid thermal oxidation (RTO). During the RTO process, the substrate 11 formed with the ROX layer 15 is rapidly heated in a chamber to a temperature ranging, and gaseous oxygen is charged into the chamber through a gas entry opening and exits the chamber through a gas exit opening, such that the thin dielectric silicon oxide layer is conformally formed to cover the ROX layer 15. The RTO process is further conducted in the chamber at the temperature range, with continuous charge and discharge of the gaseous oxygen into and from the chamber through the gas entry opening and the gas exit opening, respectively, so as to form the gate oxide layer 16 on the substrate 11.

In some embodiments, the gate oxide layer 16 is a pad oxide layer formed by thermally oxidizing a semiconductor substrate such as a silicon substrate, and a silicon nitride layer is deposited on the pad oxide. After the field oxide isolation structure is formed, the silicon nitride layer and the pad oxide layer are removed, respectively, usually by wet etching with hot phosphoric acid and an aqueous solution of hydrofluoric acid.

The poly gate 20 disposed on the I/O oxide layer portion 161 and the poly straps 22 disposed on the ROX layer portion 162 are formed by the same process and have the same thickness along the Z-axis. For example, a polysilicon layer is to have a suitable thickness on the gate oxide layer 16 by a suitable deposition process as is known to those skilled in the art of semiconductor fabrication, for example but not limited to, CVD, ALD, high density plasma CVD (HDP-CVD), remote plasma CVD (RPCVD), PECVD, or PEALD. Other suitable deposition processes are within the contemplated scope of the present disclosure. In some embodiments, the polysilicon layer may be formed by CVD using silane ($SiH_4$) as a chemical gas. In some embodiments, the polysilicon layer may have a thickness ranging from 400 Å to 800 Å. A hard mask layer (not shown) is patterned using photolithography and photoresist developing technology as known to those skilled in the art of semiconductor fabrication. For example, the hard mask layer may be patterned using immersion lithography or extreme ultraviolet (EUV) lithography. The pattern formed in the hard mask layer is then transferred to the polysilicon layer by etching (for example but not limited to, dry etching) so as to form the poly gate 20 on the I/O oxide layer portion 161 and the poly straps 22 on the ROX layer portion 162.

The poly gate 20 is disposed over an interface between the N-type well region 12 and the P-type well region 14, and extends along the interface between the N-type well region 12 and the P-type well region 14, e.g., extending along the Y-axis. In other words, the poly gate 20 overlaps the interface between the N-type well region 12 and the P-type well region 14. The poly straps 22 are arranged in a line along the Y-axis. Along the X-axis, a width W1 of the poly gate 20 is greater than a width W2 of the poly straps 22. Along the Y-axis, a length L1 of the poly gate 20 is greater than a length L2 of the poly straps 22. In the semiconductor device 10, the poly straps 22 are the same length. In some embodiments, the poly straps 22 may be of different lengths. Furthermore, the number of poly straps 22 is an example and is not intended to limit the disclosure. In some embodiments, the semiconductor device 10 may include more or fewer poly straps 22 on the ROX layer portion 162.

Referring to FIG. 1, the method 100 proceeds to operation S110, in which a dielectric buffer layer is formed, and then to operation S112, in which multiple inner spacers and multiple outer spacers are formed.

Figure 5:
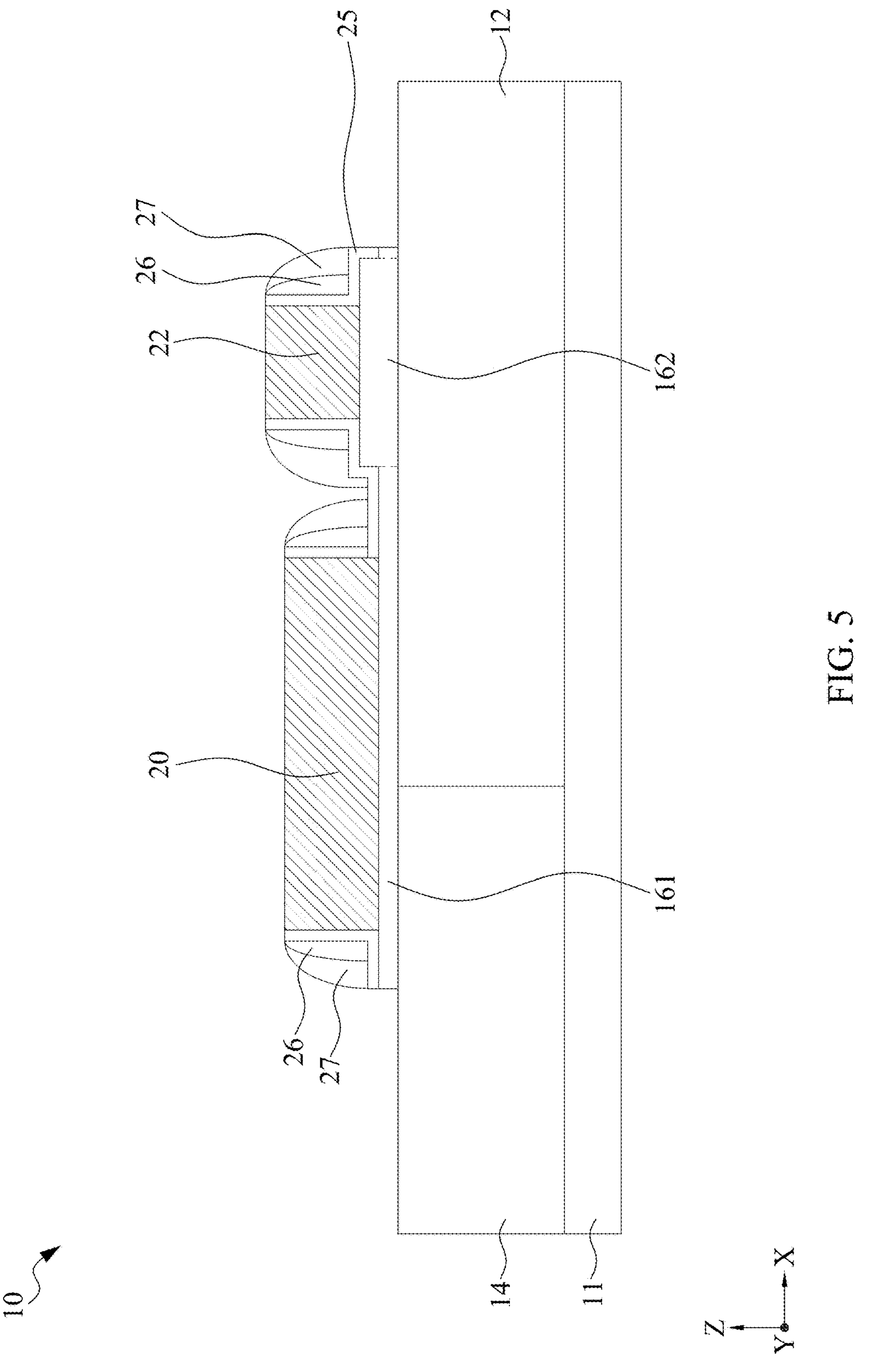
Figure 6:
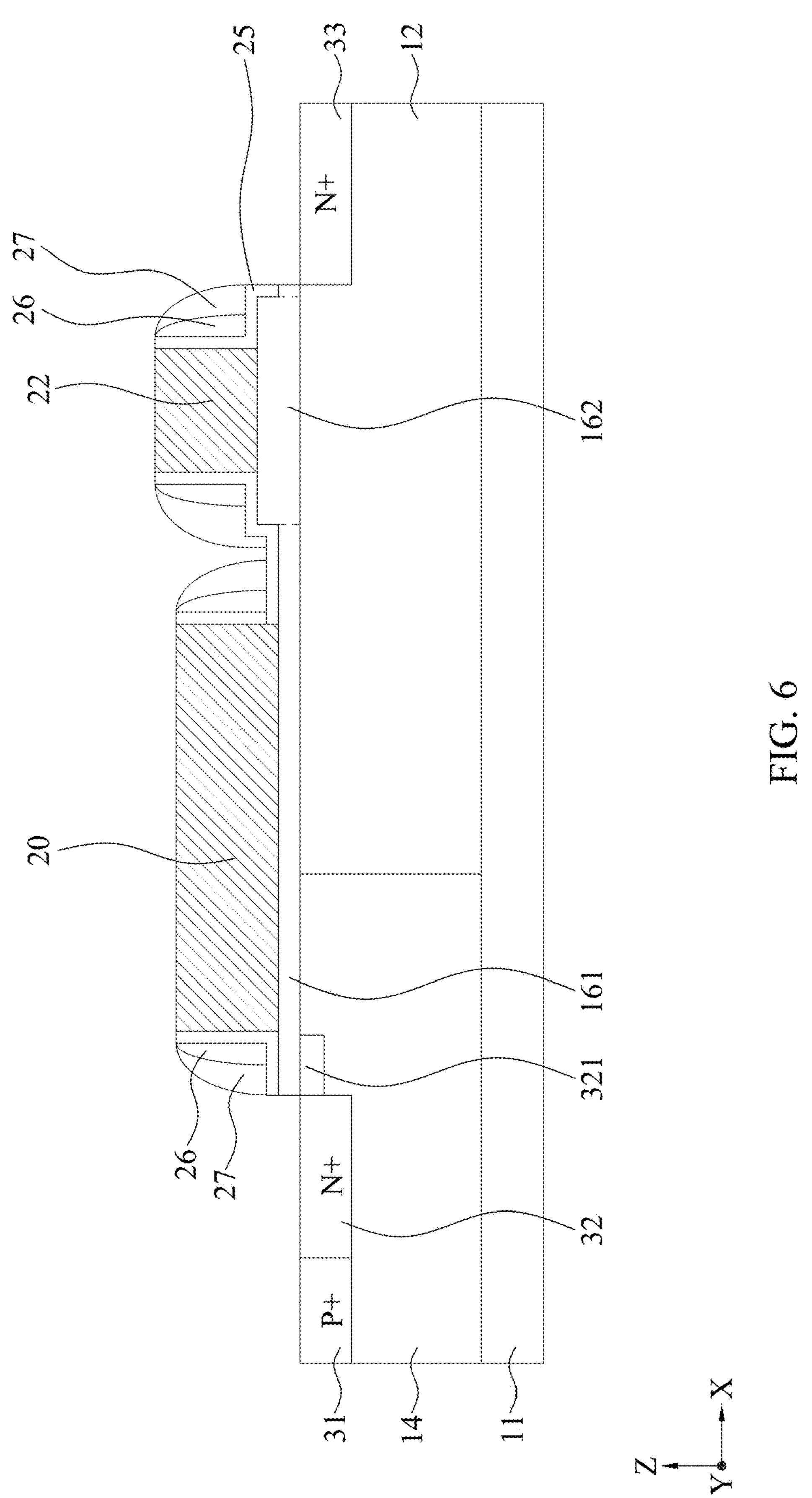
Figure 7:
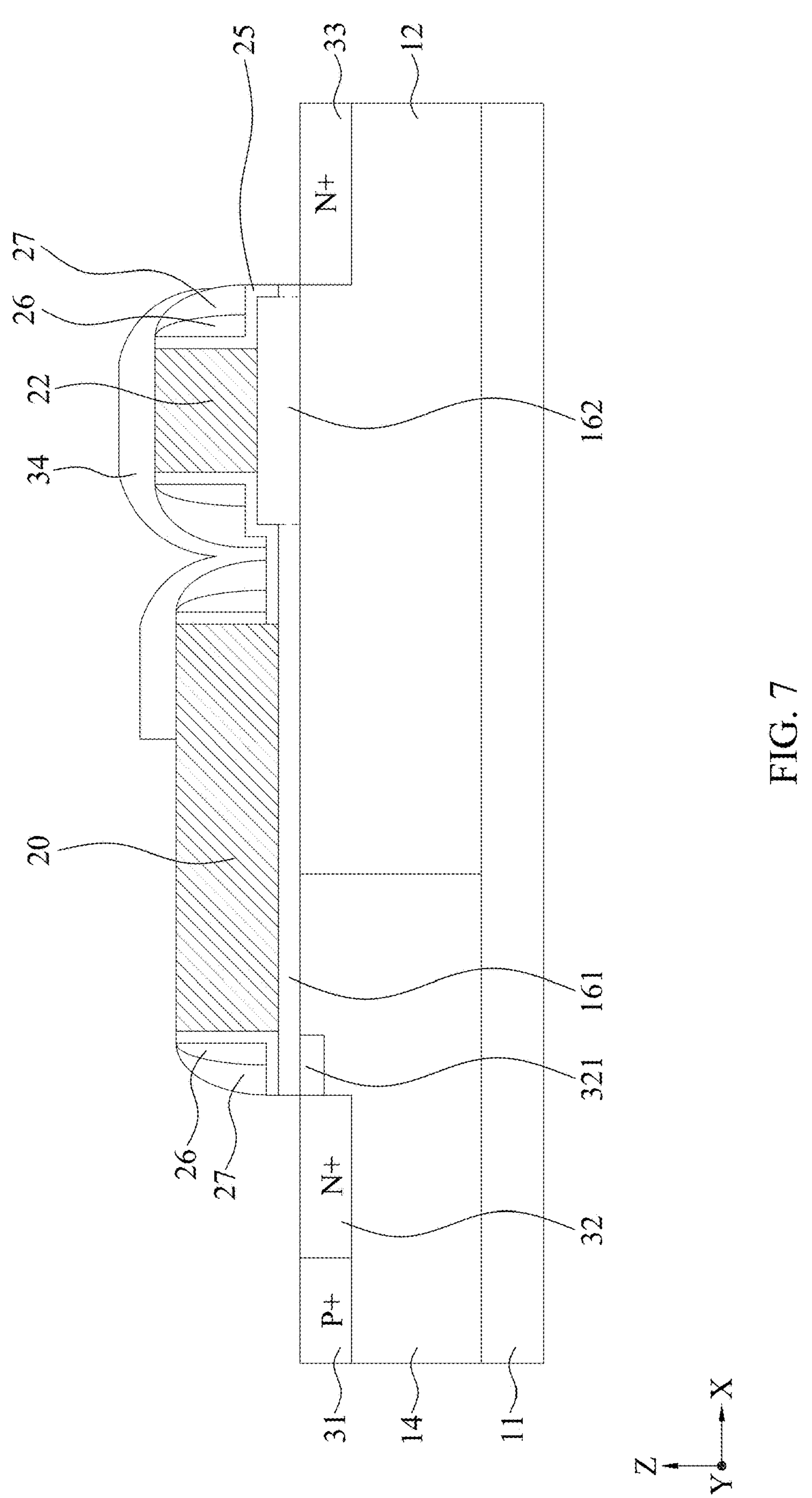
Figure 8:
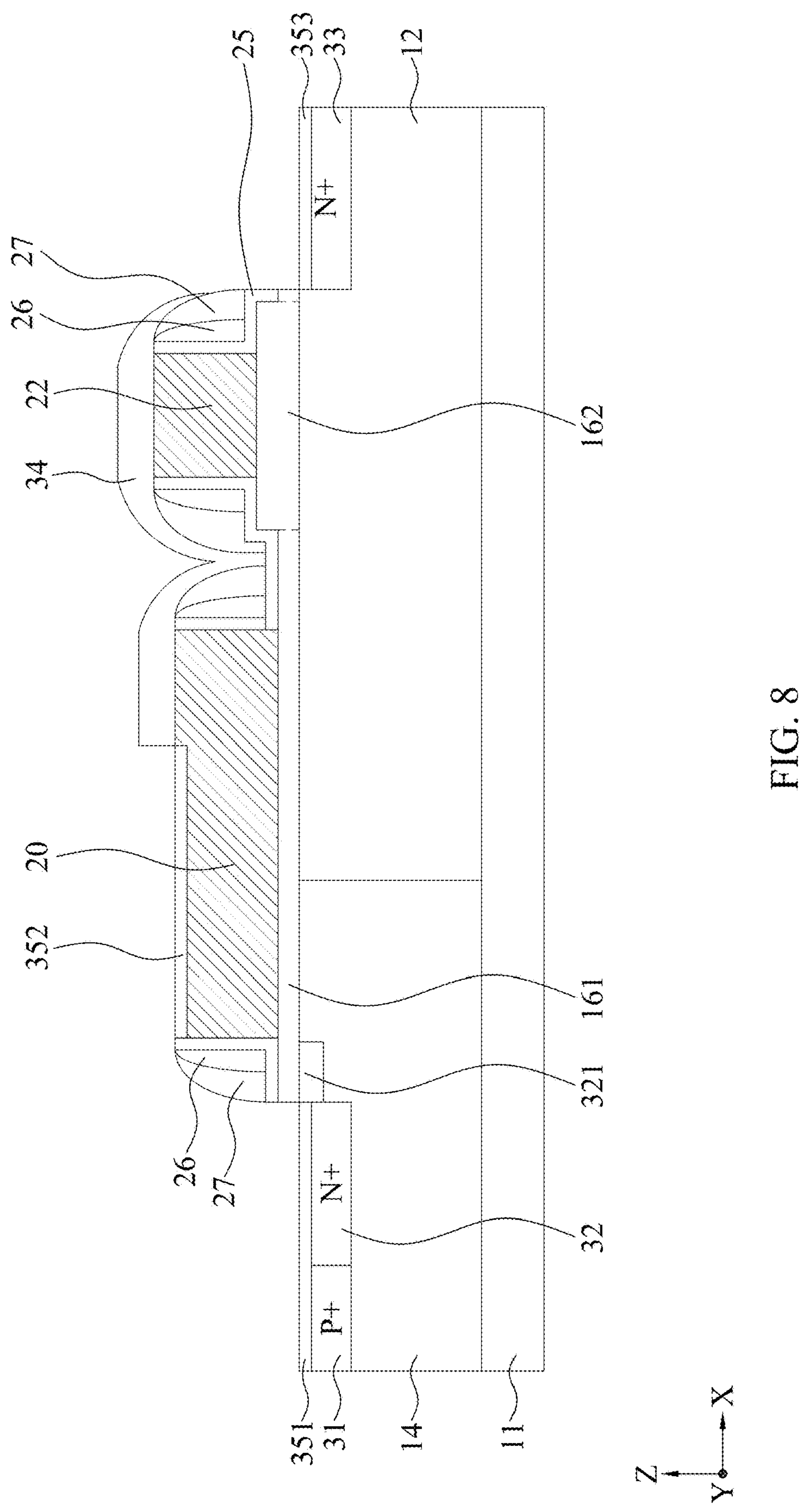
Figure 9:
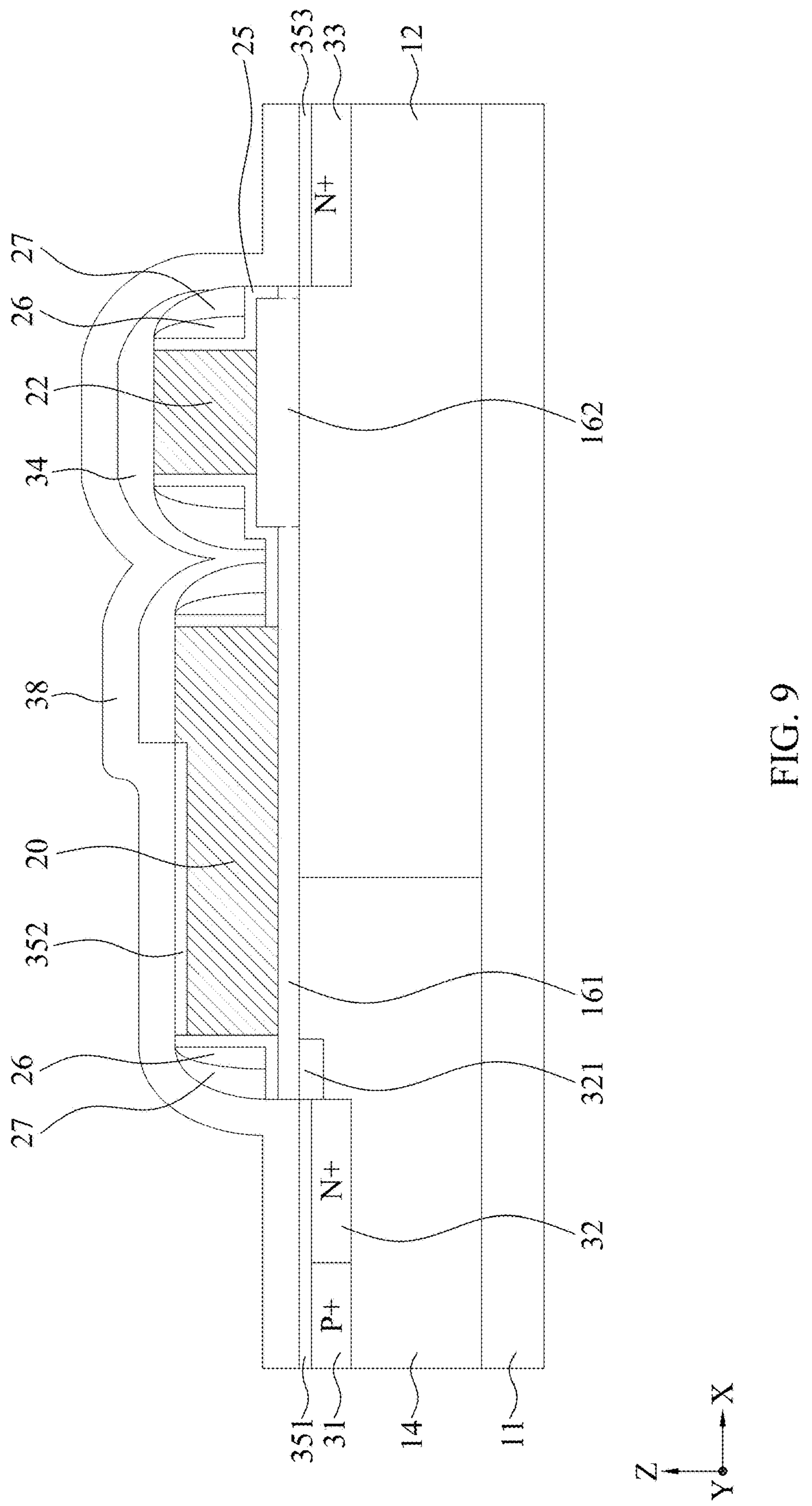

Referring to the example of FIG. 5, a dielectric buffer layer 25, for example but not limited to, a dielectric silicon oxide layer, is formed. The dielectric buffer layer 25 is formed on the gate oxide layer 16 and the sidewalls of the poly gate 21 and the poly straps 22. In some embodiments, the dielectric buffer layer 25 is conformally deposited to cover the poly gate 21, the poly straps, the gate oxide layer 16 and the substrate 11 and then the dielectric buffer layer 25 overlapping the substrate 11, the poly gate 21 and the poly straps 22 is removed. The deposition and removal of the dielectric buffer layer 25 may be performed using suitable processes as are known to those skilled in the art of semiconductor fabrication.

The inner spacers 26 extend upwardly from horizontal portions of the dielectric buffer layer 25 and laterally cover vertical portions of the dielectric buffer layer 25. The outer spacers 27 extend upwardly from horizontal portions of the dielectric buffer layer 25 and laterally cover vertical portions of the inner spacers 26. The spacer processes of the inner spacers 26 and the outer spacers 27 may be performed using suitable processes as are known to those skilled in the art of semiconductor fabrication. The inner spacers 26 and the outer spacers 27 are formed by different spacer layers. Each spacer layer may be of a dielectric material, for example but not limited to, silicon oxide, silicon nitride, silicon carbide, silicon oxycarbide, silicon oxynitride, silicon carbonitride, silicon oxycarbonitride, or combinations thereof. Other suitable dielectric materials are within the contemplated scope of the present disclosure. In some embodiments, the inner spacers 26 include a low-k material (e.g., with a k-value lower than about 3.9), such as silicon oxy-carbon nitride (SiOCN) or silicon oxy-carbide (SiOC), and the outer spacers 27 include silicon nitride (SiN).

Referring to FIG. 1, the method 100 then proceeds to operation S114, in which source and drain regions are formed. Referring to the example of FIG. 6, a first source region (or a bulk region) 31, a second source region 32, and a lightly doped drain (LDD) region 321 are formed in the P-type well region 14, and a drain region 33 is formed in the N-type well region 12. The second source region 32 is disposed adjacent to the poly gate 20, and the LDD region 321 is formed below the inner spacer 26 and outer spacer 27. The first source region 31 and the LDD region 321 are arranged on opposite sides of the second source region 32. The drain region 33 is disposed adjacent to the poly straps 22. The second source region 32 and drain region 33 are formed simultaneously by doping the P-type well region 14 and the N-type well region 12 with an N-type dopant, for example but not limited to, phosphorous or arsenic, through a patterned photoresist layer (not shown) removed after the second source region 32 and the drain region 33 are formed. Furthermore, the first source region 31 is formed by doping the P-type well region 14 with a P-type dopant.

Referring to FIG. 1, the method 100 then proceeds to operation S116, in which a resist protect oxide (RPO) layer is formed. Referring to the example of FIG. 7, a RPO layer 34 is formed over a portion of the poly gate 20 and the corresponding inner spacer 26 and the corresponding outer spacer 27, and the poly straps 22 and the corresponding inner spacer 26 and the corresponding outer spacer 27. The RPO layer 34 may be formed by depositing a layer of oxide material, such as $SiO_2$ or any suitable oxide and then patterning the oxide layer such that the remaining oxide material completely cover the poly straps 22 and partially cover the poly gate 20. Typically, the RPO layer 34 may be deposited prior to saliciding or siliciding. The portion of the intermediate device covered by the RPO layer 34 may be protected from saliciding or siliciding by the RPO layer 34 during the saliciding or siliciding process. The RPO layer 34 may be formed by chemical vapor deposition, plasma enhanced chemical vapor deposition, atomic layer deposition or any other suitable method. In some embodiments, the RPO layer 34 may include silicon dioxide, silicon nitride, or the like. The RPO layer 34 may function as a silicide blocking layer during a subsequent silicide process.

Referring to FIG. 1, the method 100 then proceeds to operation S118, in which multiple salicide regions are formed. Referring to the example of FIG. 8, the salicide region 351 is formed in the upper surface of the first source region 31 and the second source region 32. The salicide region 352 is formed in the upper surface of the poly gate 20 not covered by the RPO layer 34. The salicide region 353 is formed in the upper surface of the drain region 33. The salicide regions 351, 352 and 353 are each formed by silicidation such as a self-aligned silicide process (sometimes referred to as a salicide process) in which a metal material is formed next to a structure or region containing silicon, then the temperature is raised to anneal and cause reaction between the silicon and the metal to form a silicide layer, and un-reacted metal is etched away. The silicide region may be self-aligned on various features such as a source region, drain region and/or gate electrode to reduce corresponding contact resistance.

Referring to FIG. 1, the method 100 then proceeds to operation S120, in which a contact etch stop layer (CESL) is formed. Referring to the example of FIG. 9, a CESL 38 is conformally formed over the intermediate structure of FIG. 8. In some embodiments, the CESL 38 may be of silicon nitride, silicon oxynitride, or any other suitable material, and serves as a stop layer for one or more etching processes performed to form a contact hole for a source region, a drain region or a gate structure. The CESL 38 may be deposited by chemical vapor deposition, plasma enhanced chemical vapor deposition, atomic layer deposition or any other suitable method.

Referring to FIG. 1, the method 100 proceeds to operation S122, in which a dielectric layer is formed, and then to operation S124, in which multiple contact plugs are formed, and then the semiconductor device 10 is formed.

While disclosed method 100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 10:
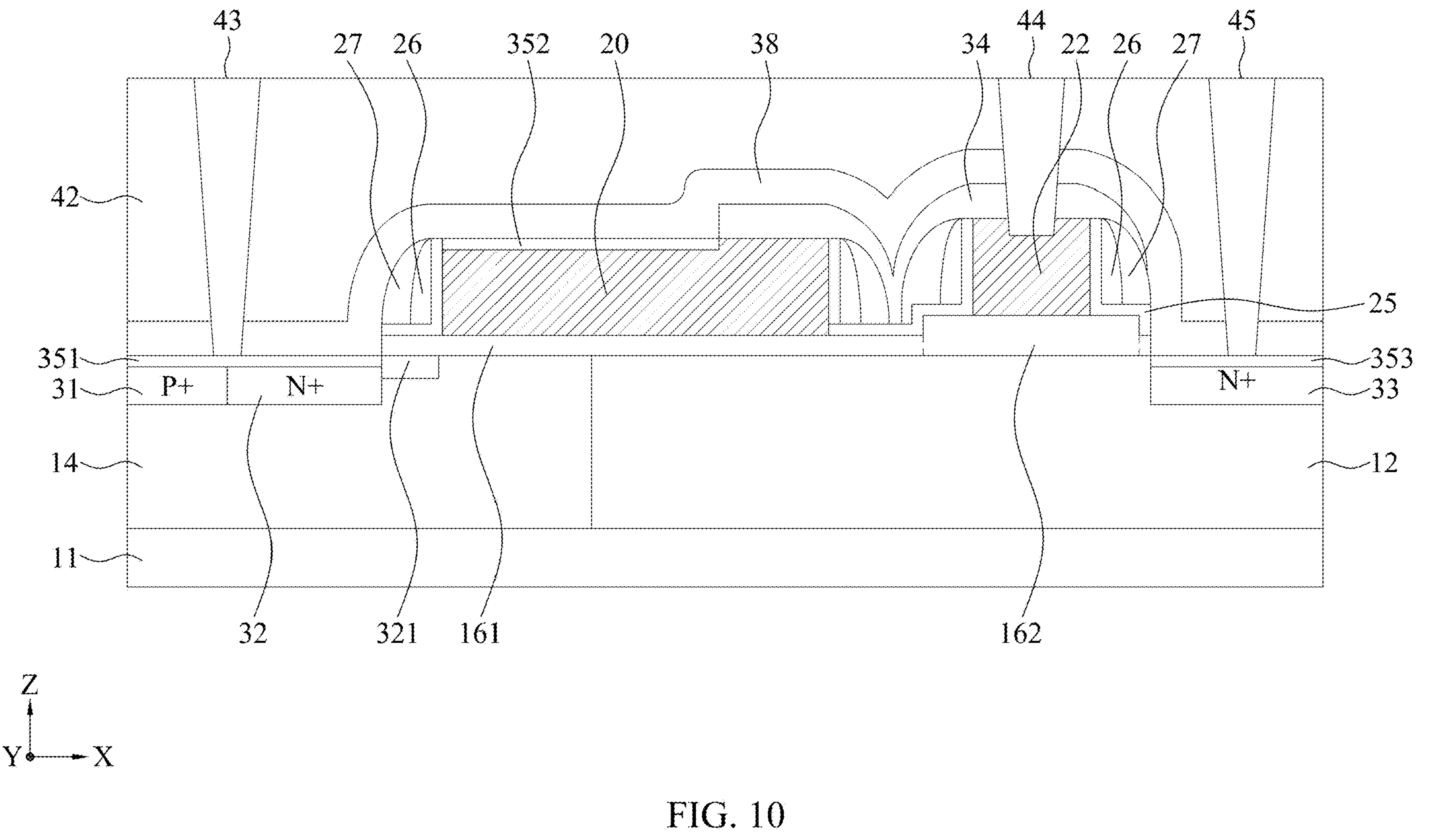

Referring to the example of FIG. 10, an interlayer dielectric (ILD) layer 42 is formed over the CESL 38. The ILD layer 42 is formed with a thickness sufficient to embed or otherwise overlay features currently formed over the substrate 11. For example, features of the semiconductor device 10 at the current fabrication stage, lined by the CESL 38, may be further overlaid by the ILD layer 42. In some embodiments, multiple ILD layers are formed over the CESL 38.

In some embodiments, the ILD layer 42 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method such as CVD, PECVD, or FCVD. After the ILD is formed, an optional dielectric protection layer (not shown) is formed over the ILD. The dielectric protection layer can prevent or reduce the loss of the ILD in subsequent etching processes. The dielectric protection layer may be formed of a suitable material such as silicon nitride, silicon carbonitride, or the like, using a suitable method such as CVD, PECVD, or FCVD.

In FIG. 10, the contact plugs 43-45 are formed to extend through the ILD layer 42 to electrically couple to the corresponding features. For example, the contact plug 43 penetrates the ILD layer 42 and the CESL 38 to contact the salicide region 351, and the contact plug 43 serves as a connecting feature (e.g., a contact) for the first source region 31 and the second source region 32. The contact plug 45 penetrates the ILD layer 42 and the CESL 38 to contact the salicide region 353, and the contact plug 45 serves as a connecting feature (e.g., a contact) for the drain region 33. The contact plug 44 penetrates the ILD layer 42, the CESL 38 and the RPO layer 34 into the poly strap 22, and the contact plug 44 serves as a CFP feature for the semiconductor device 10. In some embodiments, the bottom surface of the contact plug 44 is lower than the top surface of the poly strap 22. In some embodiments, the contact plugs 43 and 45 have the same height along the Z-axis, and the contact plug 44 is shorter than the contact plugs 43 and 45 along the same. In some embodiments, the contact plugs 43-45 are formed by one or more conductive materials. In some embodiments, the one or more conductive materials may include tungsten (W), titanium (Ti), titanium nitride (TiN), and/or tantalum nitride (TaN).

To prevent over-etching of a field plate opening or under-etching of contact openings, a composite etch stop layer controls etching depth of a field plate opening in a conventional CFP BCD. By controlling etching depth of a field plate opening, the composite etch stop layer allows contact features and the CFP to be accurately formed at different heights. The composite etch stop layer is formed by stacking different dielectric materials (e.g., multiple films) having different etching properties, and the multiple film stresses in the composite etch stop layer will cause film cracks, and then the CFP features connected to the drain region may be shorted to the active region, thus causing conventional CFP BCD damage. Furthermore, a thickness variation of the composite etch stop layer will degrade intrinsic ILD CMP uniformity.

During contact dry etching of the contact plugs, each poly strap 22 can provide a soft-landing for forming a field plate opening in the ILD layer 42. Compared with conventional CFP BCD, the etching depth of the field plate openings is controlled through the poly straps 22 without the composite etch stop layer, thereby preventing ILD/CFP dielectric gap filling capability concerns and impaired intrinsic ILD CMP uniformity. Furthermore, formation of the semiconductor device 10 is compatible with the logic processes in the BCD without additional process of composite etch stop layer, thereby decreasing process cost. In the semiconductor device 10, the thicker ROX layer 15 is used as a dielectric layer for the poly straps 22, that can replace the composite etch stop layer, thereby decreasing gate induced drain leakage (GIDL) in the semiconductor device 10.

Figure 11:
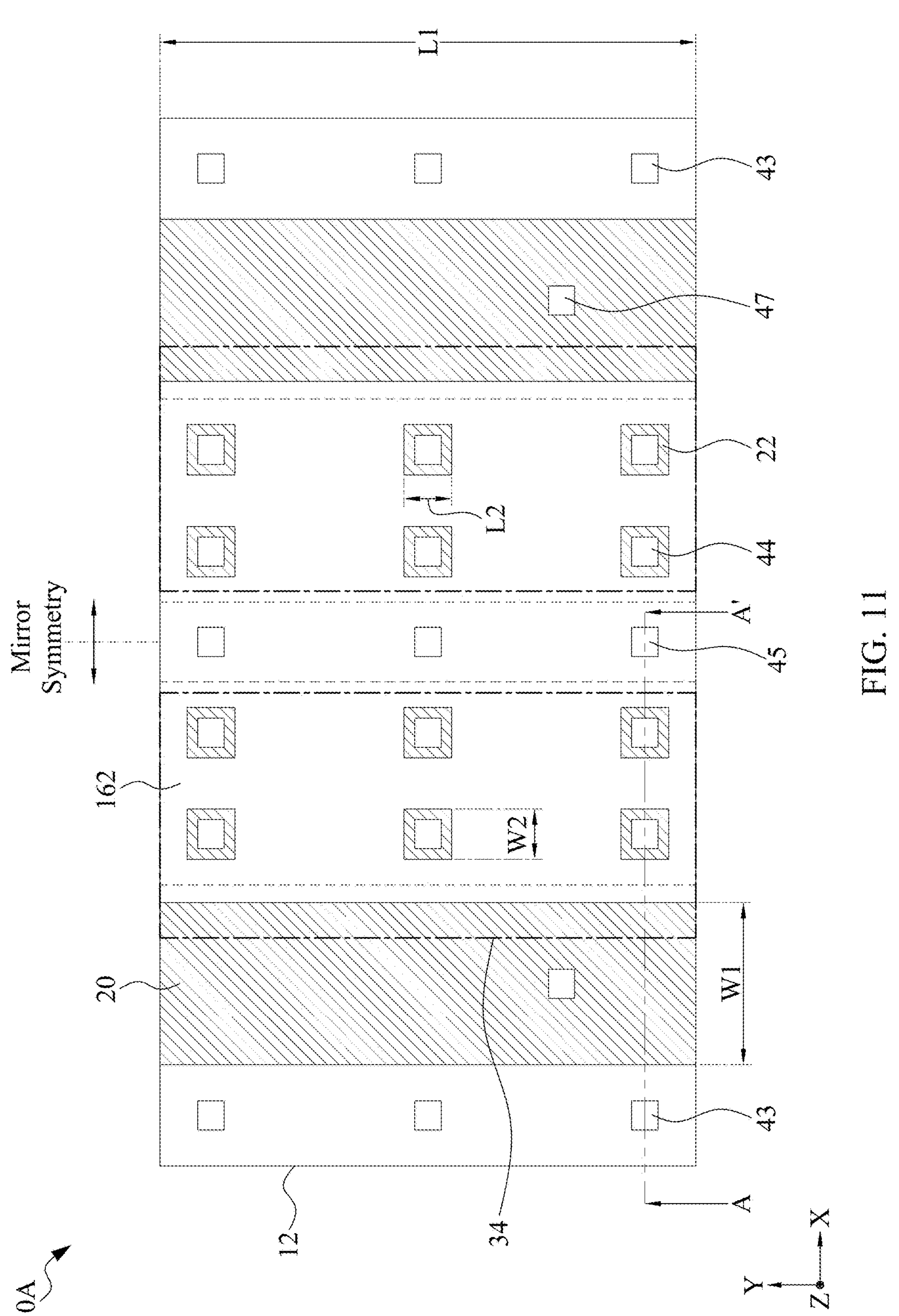
FIG. 11 is a top view of a semiconductor device, in accordance with some embodiments of the disclosure.

FIG. 11 is a top view of the semiconductor device 10A, in accordance with some embodiments of the disclosure. The semiconductor device 10A is a common drain structure symmetrical along a Y-axis. In the semiconductor device 10A, the poly gate 20 has a width W1 along the X-axis and a length L1 along the Y-axis. The poly straps 22 are formed over the ROX layer portion 162 and have a width W2 along the X-axis and a length L2 along the Y-axis. In some embodiments, the width W2 is substantially equal to the length L2. The RPO layer 34 is configured to completely cover the poly straps 22 and partially cover the poly gate 20.

Figure 12:
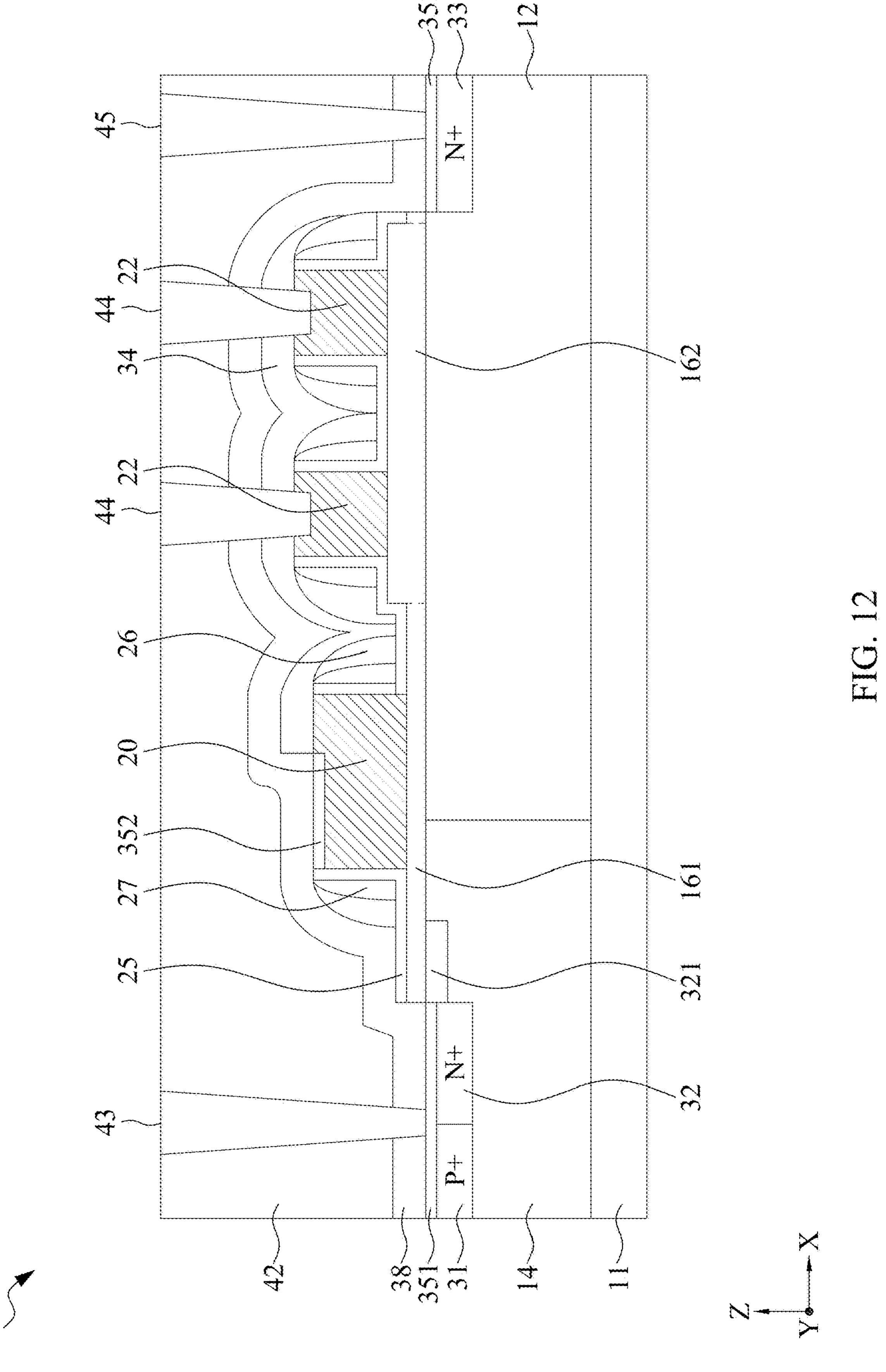
FIG. 12 is a cross-section of the semiconductor device of FIG. 11 along line A-A', in accordance with some embodiments of the present disclosure.
Figure 13:
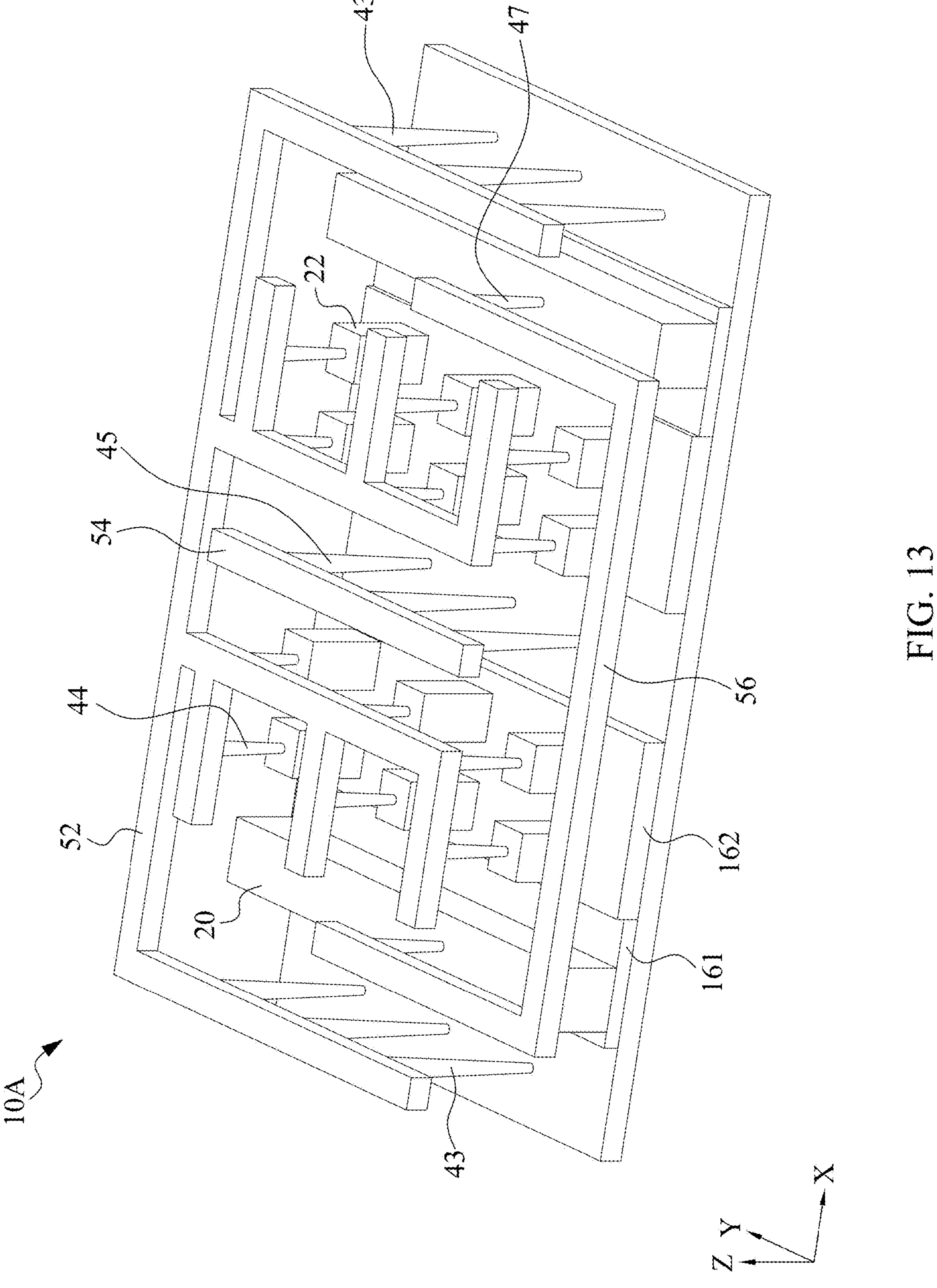
FIG. 13 is a perspective view of interconnection structures of the semiconductor device of FIG. 11, in accordance with some embodiments of the present disclosure.

FIG. 12 is a cross-section of the semiconductor device 10A of FIG. 11 along line A-A', and FIG. 13 is a perspective view of interconnection structures of the semiconductor device 10A of FIG. 11, in accordance with some embodiments of the present disclosure. In order to simplify the description, some features of the semiconductor device 10A will be omitted in FIG. 13.

Referring to FIGS. 11 to 13, the contact plugs 43 are configured to connect the first source region 31 and the second source region 32 to an interconnection structure 52. The contact plugs 45 are configured to connect the drain region 33 to an interconnection structure 54. The contact plugs 47 are configured to connect the poly gate 20 to an interconnection structure 56. The contact plugs 44 are configured to serve as the CFPs and to connect the poly straps 22 to the first source region 31 and the second source region 32 through the interconnection structure 52 and the contact plugs 43. In some embodiments, the contact plugs 43, 44 and 45 are aligned along the Y-axis from a top view. In some embodiments, the interconnection structures 52, 54 and 56 are formed in the lowest metal layer in BEOL process.

In the semiconductor device 10A, each poly strap 22 is coupled to the interconnection structure 52 through respective contact plug 44, and the contact plug 44 is disposed at the center of the poly strap 22 from a top view. Compared with the semiconductor device 10 of FIG. 10, the semiconductor device 10A has more poly straps 22 formed over the ROX layer portion 162, and the poly straps 22 are arranged in an array. For example, half of the poly straps 22 are arranged in a first column along the Y-axis, and the remaining poly straps 22 are arranged in a second column along the Y-axis. The distance from the poly gate 20 to each poly strap 22 in the first column is the same, and the distance from the poly gate 20 to each poly strap 22 in the second column is the same. In some embodiments, the first and second lines in the array have different numbers of poly straps 22. The poly straps 22 of the first line and the poly straps 22 of the second line are separated by the inner spacers 26 and the outer spacers 27.

Figure 14:
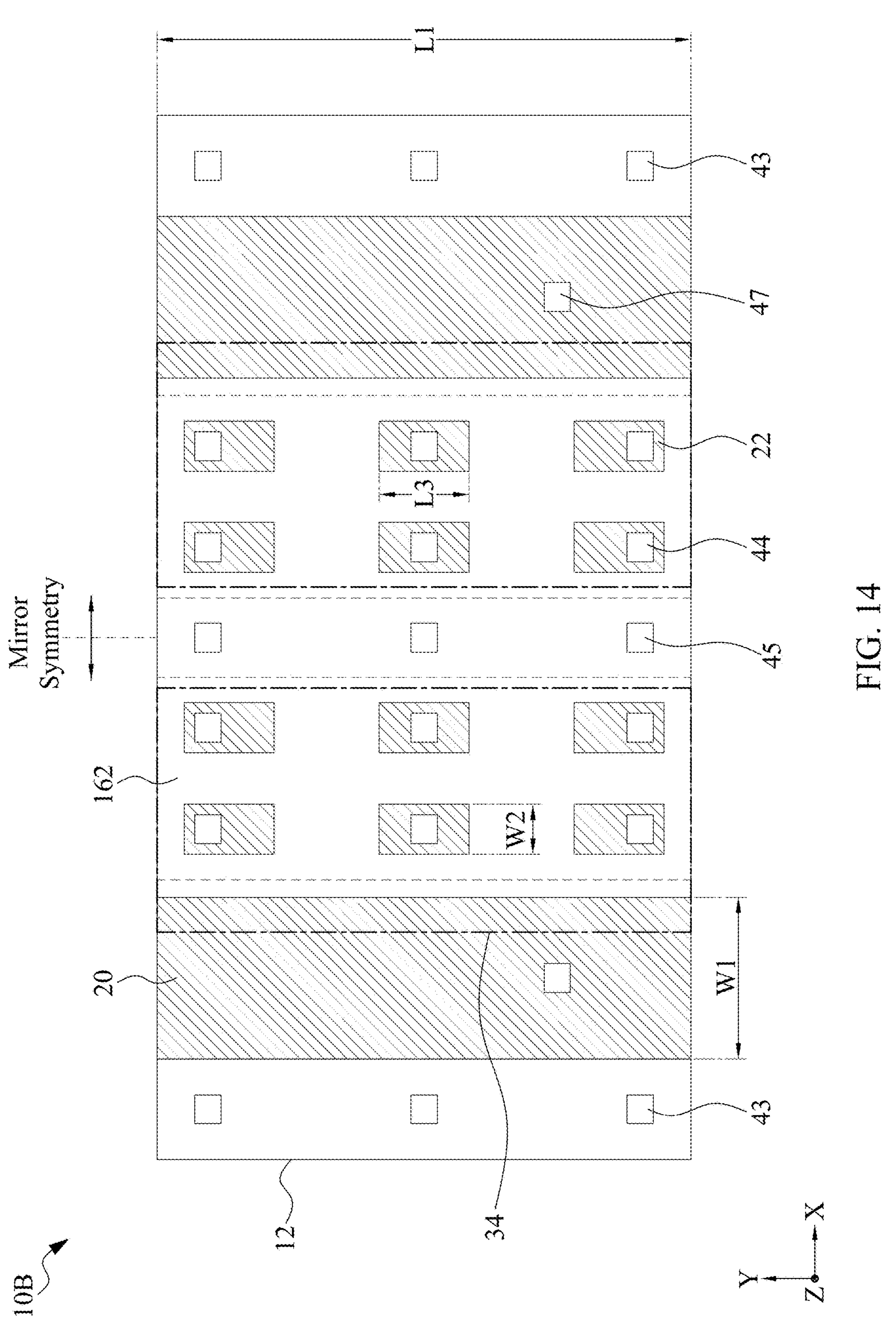
FIG. 14 is a top view of a semiconductor device, in accordance with some embodiments of the disclosure.

FIG. 14 is a top view of the semiconductor device 10B, in accordance with some embodiments of the disclosure. The semiconductor device 10B is a common drain structure symmetrical along a Y-axis. In the semiconductor device 10B, the poly gate 20 has a width W1 along the X-axis and a length L1 along the Y-axis. The poly straps 22 are formed over the ROX layer portion 162 and have a width W2 along the X-axis and a length L3 along the Y-axis. The length L3 is greater than the length L2 and the width W2. The RPO layer 34 is configured to completely cover the poly straps 22 and partially cover the poly gate 20.

In the semiconductor device 10B, each poly strap 22 is coupled to the corresponding interconnection structure (e.g., the interconnection structure 52 of FIG. 13) through respective contact plug 44. Furthermore, the contact plugs 44 are disposed at different locations on the poly strap 22 from a top view. The poly straps 22 are arranged in an array. For example, half of the poly straps 22 are arranged in a first column along the Y-axis, and the remaining poly straps 22 are arranged in a second column along the Y-axis. The distance from the poly gate 20 to each poly strap 22 in the first column is the same, and the distance from the poly gate 20 to each poly strap 22 in the second column is the same. The poly straps 22 of the first line and the poly straps 22 of the second line are separated by the inner spacers 26 and the outer spacers 27. In some embodiments, the first and second columns in the array have different numbers of poly straps 22. In some embodiments, the poly straps in the first column and the poly straps in the second column have different shapes or different sizes.

Figure 15:
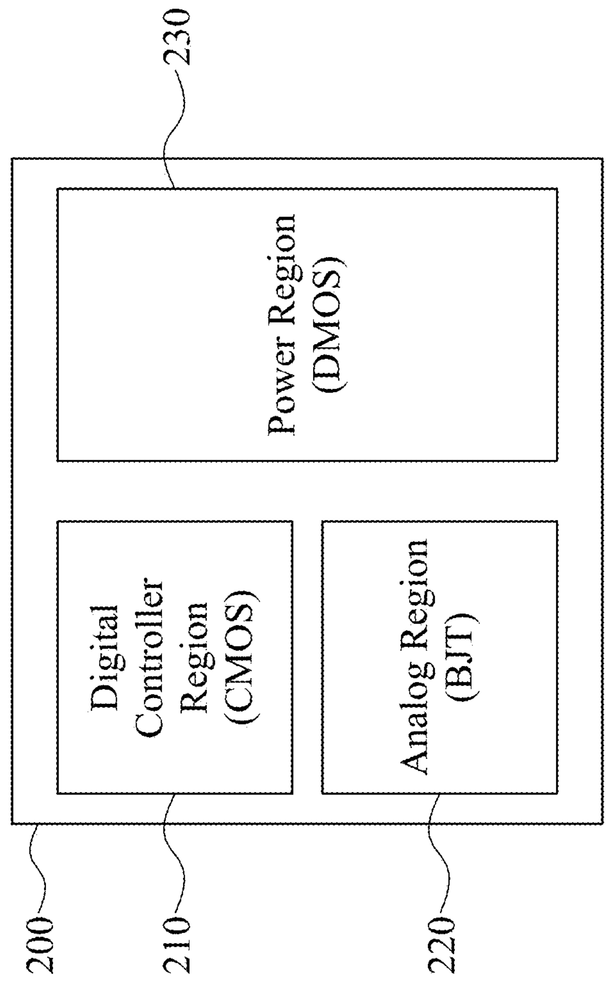
FIG. 15 is an integrated semiconductor device, in accordance with some embodiments of the disclosure.

FIG. 15 is an integrated semiconductor device 200, in accordance with some embodiments of the disclosure. The integrated semiconductor device 200 is a BCD device, and includes a digital controller region 210 with CMOS transistors, an analog region 220 with BJTs, and a power region 230 with DMOS transistors (e.g., the semiconductor devices 10, 10A and 10B). In various embodiments, the DMOS transistors of the power region 230 may include high voltage applications that may benefit from the additional application of CFPs with poly straps as discussed in any of the embodiments above.

In some embodiments, the power region 230 is arranged in a high voltage area, and the digital controller region 210 and the analog region 220 are arranged in a low voltage area. In some embodiments, the devices in the high voltage area operate at voltages greater than 10V, such as greater than 50V, such as greater than 100V, such as greater than 200V. The devices in the low voltage area operate at voltages less than 10V, such as less than 5V, such as less than 3V.

According to some embodiments, a method for manufacturing a semiconductor device is provided. The method includes the following operations. A gate oxide layer is formed over an N-type well region and a P-type well region, and the gate oxide layer includes an input/output (I/O) oxide layer portion and a reduced surface field oxide (ROX) layer portion. A poly gate is formed on the I/O oxide layer portion, and the poly gate extends along an interface between the N-type well region and the P-type well region. At least one poly strap is formed on the ROX layer portion. A resist protect oxide (RPO) layer is formed to completely cover the poly strap and partially cover the poly gate. An inter-level dielectric (ILD) layer is formed over the RPO layer. A first connecting feature penetrating the ILD layer and the RPO layer to contact the poly strap is formed.

According to some embodiments, a method for manufacturing a semiconductor device is provided. The method includes the following operations. An N-type well region is formed in a substrate. A P-type well region is formed in the substrate. A gate oxide layer is formed over the substrate, and the gate oxide layer includes a reduced surface field oxide (ROX) layer portion on the N-type well region and an input/output (I/O) oxide layer portion on the N-type well region and the P-type well region. A poly gate is formed on the I/O oxide layer portion and a plurality of poly straps on the ROX layer portion. A resist protect oxide (RPO) layer is formed to completely cover the poly straps. A contact etch stop layer is formed over the RPO layer. A plurality of first connecting features penetrating the contact etch stop layer and the RPO layer to contact the poly straps are formed.

According to some embodiments, a semiconductor device is provided. The semiconductor device includes a gate oxide layer, a poly gate, a plurality of poly straps, a resist protect oxide (RPO) layer, a contact etch stop layer, and a plurality of contact field plate (CFP) features. The gate oxide layer includes a reduced surface field oxide (ROX) layer portion on an N-type well region, and an input/output (I/O) oxide layer portion on the N-type well region and a P-type well region. The ROX layer portion is thicker than the I/O oxide layer portion. The poly gate is disposed on the I/O oxide layer portion and extends along an interface between the N-type well region and the P-type well region. The poly straps are disposed on the ROX layer portion. The RPO layer completely covers the poly straps. The contact etch stop layer is formed over the poly gate and the RPO layer. The CFP features penetrate through the contact etch stop layer and the RPO layer to contact the poly straps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a gate oxide layer over an N-type well region and a P-type well region, wherein the gate oxide layer comprises an input/output (I/O) oxide layer portion and a reduced surface field oxide (ROX) layer portion;

forming a poly gate on the I/O oxide layer portion, wherein the poly gate extends along an interface between the N-type well region and the P-type well region;

forming at least one poly strap on the ROX layer portion;

forming a resist protect oxide (RPO) layer to completely cover the poly strap and partially cover the poly gate;

forming an inter-level dielectric (ILD) layer over the RPO layer; and forming a first connecting feature penetrating the ILD layer and the RPO layer to contact the poly strap.

2. The method of claim 1, wherein a thickness ratio of the ROX layer portion to the I/O oxide layer portion is greater than 3.

3. The method of claim 1, further comprising:

conformally forming a contact etch stop layer to cover the P-type well region, the N-type well region, the RPO layer, and the poly gate non-covering by the RPO layer, wherein the RPO layer is separated from the ILD layer by the contact etch stop layer.

4. The method of claim 3, wherein the first connecting feature is a contact field plate extending from an uppermost surface of the ILD layer into the poly strap through the contact etch stop layer and the RPO layer.

5. The method of claim 1, further comprising:

forming a source region in the P-type well region; and forming a drain region in the N-type well region, wherein the poly strap is electrically connected to the source region through the first connecting feature.

6. The method of claim 5, further comprising:

forming a plurality of second connecting features penetrating the ILD layer to the source region, the drain region and the poly gate.

7. The method of claim 5, further comprising:

forming salicide regions on a surface of the source region, a surface of the drain region and a surface of the poly gate non-covering by the RPO layer.

8. The method of claim 1, wherein the poly gate and the poly strap have the same thickness.

9. The method of claim 1, further comprising:

forming sidewall spacers on sidewalls of the poly gate and the poly strap, wherein a width of the poly gate is greater than a width of the poly strap in a direction perpendicular to the interface between the N-type well region and the P-type well region.

10. A method for manufacturing a semiconductor device, comprising:

forming an N-type well region in a substrate;

forming a P-type well region in the substrate;

forming a gate oxide layer over the substrate, wherein the gate oxide layer comprises a reduced surface field oxide (ROX) layer portion on the N-type well region and an input/output (I/O) oxide layer portion on the N-type well region and the P-type well region;

forming a poly gate on the I/O oxide layer portion and a plurality of poly straps on the ROX layer portion;

forming a resist protect oxide (RPO) layer to completely cover the poly straps;

forming a contact etch stop layer over the RPO layer; and forming a plurality of first connecting features penetrating the contact etch stop layer and the RPO layer to contact the poly straps.

11. The method of claim 10, wherein the poly gate extends along a first axis parallel to an interface between the N-type well region and the P-type well region, and the poly straps are arranged in at least one line along the first axis.

12. The method of claim 10, wherein a thickness ratio of the ROX layer portion to the I/O oxide layer portion is greater than 3.

13. The method of claim 10, further comprising:

forming an inter-level dielectric (ILD) layer over the contact etch stop layer, wherein each of the first connecting features is a contact field plate extending from an uppermost surface of the ILD layer into respective poly strap through the contact etch stop layer and the RPO layer.

14. The method of claim 10, further comprising:

forming a source region in the P-type well region; and forming a drain region in the N-type well region, wherein the poly straps are electrically connected to the source region through the first connecting features.

15. The method of claim 14, further comprising:

forming a plurality of second connecting features penetrating the contact etch stop layer to the source region, the drain region and the poly gate.

16. A semiconductor device, comprising:

a gate oxide layer, comprising:

a reduced surface field oxide (ROX) layer portion on an N-type well region; and an input/output (I/O) oxide layer portion on the N-type well region and a P-type well region, wherein the ROX layer portion is thicker than the I/O oxide layer portion;

a poly gate disposed on the I/O oxide layer portion and extending along an interface between the N-type well region and the P-type well region;

a plurality of poly straps disposed on the ROX layer portion;

a resist protect oxide (RPO) layer completely covering the poly straps;

a contact etch stop layer over the poly gate and the RPO layer; and a plurality of contact field plate (CFP) features penetrating the contact etch stop layer and the RPO layer to contact the poly straps.

17. The semiconductor device of claim 16, further comprising:

a source region formed in the P-type well region; and a drain region formed in the N-type well region, wherein the poly straps are electrically connected to the source region through the CFP features.

18. The semiconductor device of claim 17, further comprising:

an inter-level dielectric (ILD) layer over the contact etch stop layer; and a plurality of connecting features penetrating the ILD layer and the contact etch stop layer to the source region, the drain region and the poly gate.

19. The semiconductor device of claim 16, wherein the poly gate is partially covered by the RPO layer, and a salicide region is formed between the contact etch stop layer and the poly gate non-covering by the RPO layer.

20. The semiconductor device of claim 16, wherein the poly straps are arranged in an array from a top view, and the poly gate is longer than the poly straps.

* * * * *